US009670385B2

(12) United States Patent
Namiki et al.

(10) Patent No.: US 9,670,385 B2
(45) Date of Patent: Jun. 6, 2017

(54) ANISOTROPIC CONDUCTIVE ADHESIVE (71) Applicant: DEXERIALS CORPORATION, Tokyo (JP)

(72) Inventors: Hidetsugu Namiki, Tochigi (JP); Shiyuki Kanisawa, Tochigi (JP); Akira Ishigami, Tochigi (JP); Masaharu Aoki, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/116,081

(22) PCT Filed: Feb. 13, 2015

(86) PCT No.: PCT/JP2015/053957
§ 371 (c)(1),
(2) Date: Aug. 2, 2016

(87) PCT Pub. No.: WO2015/141343
PCT Pub. Date: Sep. 24, 2015

(65) Prior Publication Data
US 2017/0121571 A1 May 4, 2017

(30) Foreign Application Priority Data
Mar. 19, 2014 (JP) .................. 2014-056263

(51) Int. Cl.
*H01L 33/00* (2010.01)
*C09J 9/02* (2006.01)
(Continued)

(52) U.S. Cl.
CPC ...... *C09J 9/02* (2013.01); *C08K 3/22* (2013.01); *C08K 9/02* (2013.01); *C09J 11/04* (2013.01);
(Continued)

(58) Field of Classification Search
CPC ....... H01L 33/62; H01L 33/60; H01L 33/641; H01L 33/644; H01L 33/647;
(Continued)

(56) References Cited

U.S. PATENT DOCUMENTS 4,740,657 A * 4/1988 Tsukagoshi .............. H01B 1/22
174/84 R
6,043,670 A * 3/2000 Degani .............. G01R 31/2886
257/E21.514
(Continued)

FOREIGN PATENT DOCUMENTS

JP    H03-129607 A    6/1991
JP    H05-152464 A    6/1993
(Continued)

OTHER PUBLICATIONS

May 19, 2015 International Search Report issued in International Patent Application No. PCT/JP2015/053957.

*Primary Examiner* — Victor A Mandala
(74) *Attorney, Agent, or Firm* — Oliff PLC (57) ABSTRACT Provided is an anisotropic conductive adhesive in which excellent optical characteristics and heat dissipation characteristics are obtainable. The anisotropic conductive adhesive contains conductive particles each comprising a metal layer having Ag as a primary constituent formed on an outermost surface of a resin particle, solder particles having a smaller average particle diameter than the conductive particles, reflective insulating particles having a smaller average particle diameter than the solder particles and a binder into which the conductive particles solder particles and reflective insulating particles are dispersed. The conductive particles and the reflective insulating particles efficiently reflect light, thereby improving light-extraction efficiency of an LED mounting body. Additionally, inter-terminal solder bonding of the solder particles during compression bonding increases (Continued)

contact area between opposing terminals, thereby enabling achievement of high heat dissipation characteristics.

19 Claims, 5 Drawing Sheets

(51) Int. Cl.
| | |
|---|---|
| *H01L 33/62* | (2010.01) |
| *C09J 11/04* | (2006.01) |
| *H01L 33/60* | (2010.01) |
| *C09J 163/00* | (2006.01) |
| *C08K 9/02* | (2006.01) |
| *C08K 3/22* | (2006.01) |
| *H01L 33/64* | (2010.01) |

(52) U.S. Cl.
CPC ............ *C09J 163/00* (2013.01); *H01L 33/60* (2013.01); *H01L 33/62* (2013.01); *H01L 33/641* (2013.01); *H01L 33/644* (2013.01); *H01L 33/647* (2013.01); *C08K 2003/2241* (2013.01); *C08K 2201/001* (2013.01); *C08K 2201/003* (2013.01); *H01L 2933/0066* (2013.01); *H01L 2933/0075* (2013.01)

(58) Field of Classification Search
CPC .... H01L 2933/0075; H01L 2933/0066; C08K 9/02; C08K 3/22; C08K 2201/003; C08K 2201/001; C08K 2003/2241; C09J 9/02; C09J 11/04; C09J 163/00
See application file for complete search history.

(56) References Cited

U.S. PATENT DOCUMENTS

| | | | |
|---|---|---|---|
| 2009/0229123 A1* | 9/2009 | Sakai | H01L 24/29 29/854 |
| 2012/0139126 A1* | 6/2012 | Kim | H01L 23/5384 257/774 |
| 2012/0193666 A1 | 8/2012 | Namiki et al. | |
| 2012/0248495 A1* | 10/2012 | Umakoshi | H01L 24/83 257/99 |
| 2013/0264602 A1* | 10/2013 | Namiki | H01L 33/60 257/98 |
| 2014/0097548 A1* | 4/2014 | Shin | H01B 1/22 257/783 |
| 2014/0217450 A1 | 8/2014 | Ishigami et al. | |

FOREIGN PATENT DOCUMENTS

| | | |
|---|---|---|
| JP | 2003-026763 A | 1/2003 |
| JP | 2005-120357 A | 5/2005 |
| JP | 2006-108523 A | 4/2006 |
| JP | 2011-057917 A | 3/2011 |
| WO | 2011/155348 A1 | 12/2011 |
| WO | 2013/051708 A1 | 4/2013 |

* cited by examiner

FIG.10

ANISOTROPIC CONDUCTIVE ADHESIVE

TECHNICAL FIELD

The present disclosure relates to an anisotropic conductive adhesive in which conductive particles are dispersed, and more particularly relates to an anisotropic conductive adhesive capable of dissipating heat generated by chips (elements) such as LEDs (light-emitting diodes) and driver ICs (integrated circuits). This application claims priority to Japanese Patent Application No. 2014-56263 filed on Mar. 19, 2014, the entire contents of which are hereby incorporated by reference.

BACKGROUND ART

Figure 5:
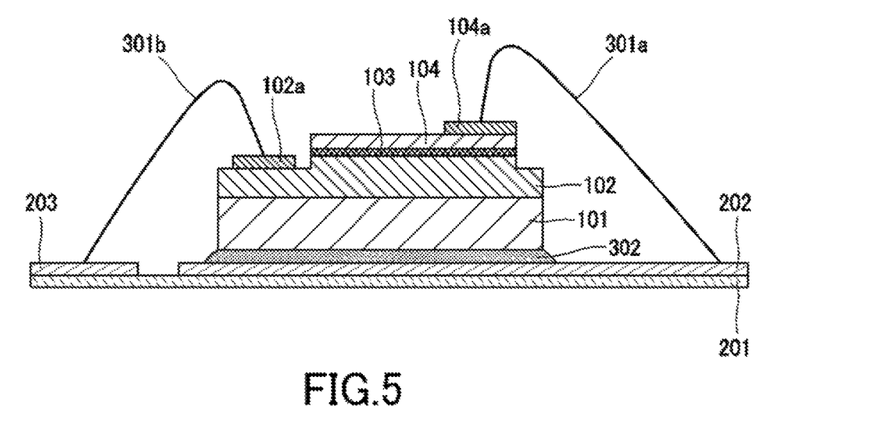
FIG. 5 is a cross sectional view illustrating one example of an LED mounting body using a conventional wire bonding method.

Conventional methods for mounting LED elements to substrates have used wire bonding methods. In a wire bonding method, as illustrated in FIG. 5, a surface having electrodes (a first conductive electrode 104a and a second conductive electrode 102a) of an LED element is faced upwards (face-up), and this LED element is electrically connected to a substrate by using wire bonds (WB) 301a and 301b, and the LED element is bonded to the substrate using a die bonding material 302.

However, in an electrical connection obtained by methods using such a wire bonding, there is a risk that the wire bond might physically break away or detach from the electrodes (the first conductive electrode 104a and the second conductive electrode 102a); more reliable techniques are thus desired. Furthermore, oven curing used in curing processes of the die bonding material 302 increases production time.

Figure 6:
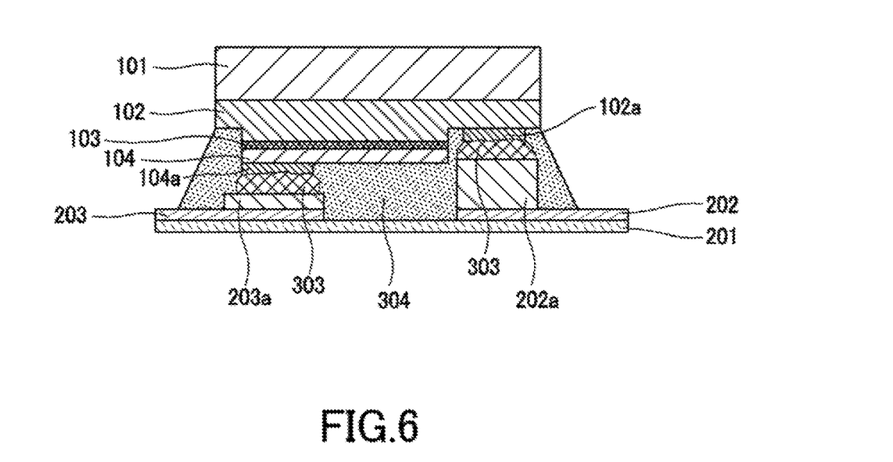
FIG. 6 is a cross-sectional view of one example of an LED mounting body using a conventional conductive paste.

As illustrated in FIG. 6, as a method in which wire bonding is not used, the surface having the electrodes (the first conductive electrode 104a and the second conductive electrode 102a) of the LED element have been faced towards the substrate (face-down, flip-chip), and the LED element and the substrate have been electrically connected using a conductive paste 303a and 303b of which silver paste is a typical example.

However, low adhesive strength of the conductive paste 303a and 303b necessitates reinforcement with a sealing resin 304. Furthermore, oven curing used in curing processes of the sealing resin 304 increases production time.

Figure 7:
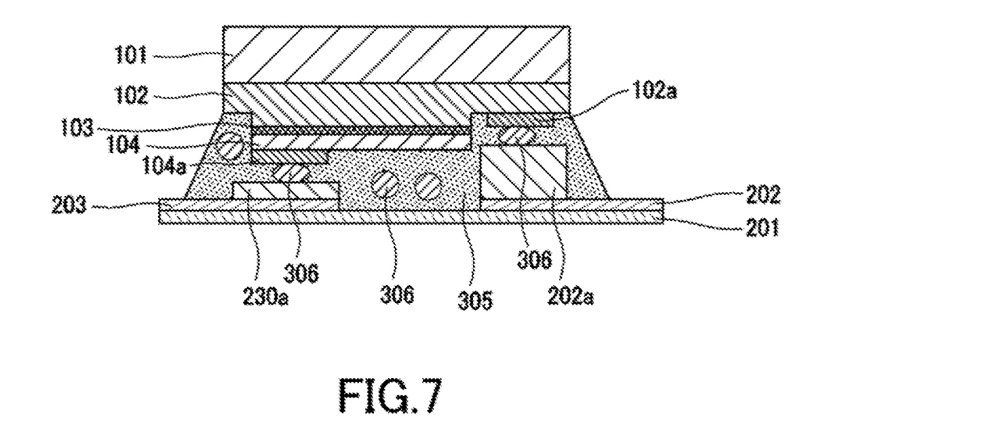
FIG. 7 is a cross-sectional view of one example of an LED mounting body using a conventional anisotropic conductive adhesive.

As illustrated in FIG. 7, as a method in which conductive paste is not used, the electrode-side surface of the LED element is faced towards the substrate (face-down, flip-chip), and an anisotropic conductive adhesive comprising an electrically insulating adhesive binder 305 having conductive particles 306 dispersed therein is used to electrically connect and bond the LED element and the substrate. Because bonding processes of anisotropic conductive adhesives are short in duration, productivity is favorable. Moreover, anisotropic conductive adhesives are inexpensive and have excellent properties such as in transparency, adhesiveness, heat tolerance, mechanical strength and electrical insulation.

In recent years, LED elements for flip-chip mounting have been under development. In such LED elements for flip-chip mounting, designs capable of large electrode surface areas are enabled by a passivation layer 105, thus enabling bumpless mounting. Furthermore, providing a reflective layer beneath an emissive layer increases light-extraction efficiency.

Figure 8:
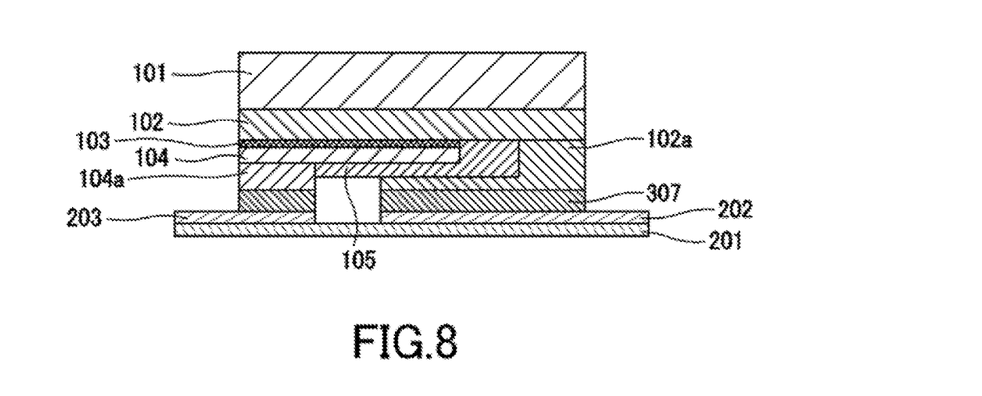
FIG. 8 is a cross-sectional view of one example of an LED mounting body using a conventional flip-chip-mounting LED mounted by using gold-tin eutectic bonding.

As illustrated in FIG. 8, gold-tin eutectic bonding can be used as a method for mounting a flip-chip-mounting LED to a substrate. Gold-eutectic bonding is a method for eutectic bonding comprising forming chip electrodes from a gold-tin alloy 307, applying a flux to a substrate, mounting the chip, and heating to connect chip electrodes to the substrate. However, in such a method using solder connection, yield rates are poor because chip misalignment during heating and flux remaining after cleaning adversely affect reliability. Moreover, advanced mounting techniques are necessary.

Figure 9:
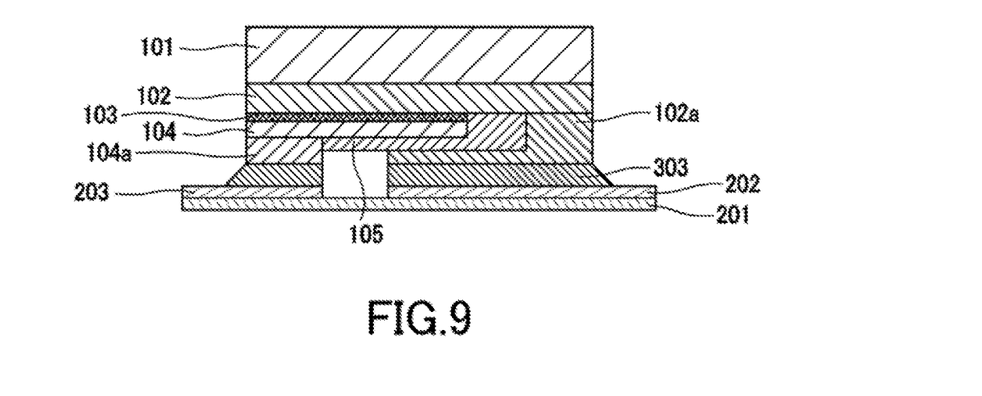
FIG. 9 is a cross-sectional view of one example of an LED mounting body using a conventional flip-chip-mounting LED mounted by using a conductive paste.

As a method in which gold-tin eutectic bonding is not used, as illustrated in FIG. 9, a solder connecting method using a solder paste 303 has been used to create electrical connections between the electrode-side surface of the LED element and the substrate. However, in such solder connection methods, isotropic conduction of the solder paste generates short circuits between p-n junction electrodes, leading to poor yield rates.

Figure 10:
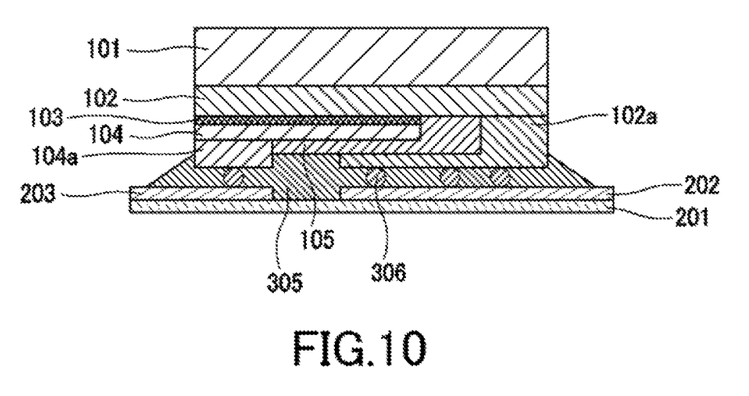
FIG. 10 is a cross-sectional view of one example of an LED mounting body using a conventional flip-chip-mounting LED mounted by using an anisotropic conductive adhesive.

As a method in which solder paste is not used, as illustrated in FIG. 10, to electrically connect and bond the LED element and the substrate, as in FIG. 7, an anisotropic conductive adhesive such as an ACF having an electrically insulating binder in which conductive particles 306 are dispersed has been used. In the anisotropic conductive adhesive, the electrically insulating binder fills spaces between p-n junction electrodes. Short circuits are thus unlikely to occur and thereby yield rates are favorable. Furthermore, because bonding processes are short in duration, productivity is favorable.

However, an active layer (junction) 103 of an LED element generates a significant amount of heat in addition to light, and an active layer temperature (Tj=junction temperature) of 100° C. or more reduces light-emission efficiency and lifetime of the LED element. A configuration enabling efficient dissipation of heat from the active layer 103 is therefore required.

In such wire bond mounting as illustrated in FIG. 5, situation of the active layer 103 in an upper portion of the LED element results in inefficient heat conduction towards the substrate side, leading to poor heat dissipation.

Flip-chip mounting as illustrated in FIGS. 6 to 10 in which the active layer 103 is situated on the substrate side enables efficient heat conduction towards the substrate side. As illustrated in FIGS. 6 and 9, in the case of bonding between electrodes with conductive paste 303a and 303b, efficient heat dissipation is enabled; however, connections made using the conductive paste 303a and 303b have poor connection reliability as described above. Furthermore, as illustrated in FIG. 8, in the case of using gold-tin eutectic bonding, connection reliability is poor as described above.

Additionally, as illustrate in FIGS. 7 and 10, by not using the conductive paste 303a and 303b and by flip-chip mounting with an anisotropic conductive adhesive such as an ACF (anisotropic conductive film) or an ACP (anisotropic conductive paste), situation of the active layer 103 near the substrate side leads to efficient heat conduction to the substrate side. Furthermore, high connection reliability is obtainable due to high adhesive strength.

PRIOR ART LITERATURE

Patent Literatures

PLT 1: Japanese Unexamined Patent Application Publication No. 2005-120357
PLT 2: Japanese Unexamined Patent Application Publication No. H05-152464
PLT 3: Japanese Unexamined Patent Application Publication No. 2003-026763

SUMMARY OF THE INVENTION

Problem to be Solved by the Invention

However, in flip-chip mounting of LED elements using conventional anisotropic conductive adhesive, because the only route for heat transmission is electrically conductive particles in electrically connected parts, sufficient dissipation towards the substrate side of heat generated by the LED element is impossible and high heat dissipation characteristics are unobtainable. Furthermore, in the case of using an anisotropic conductive adhesive, light is absorbed by the conductive particles, thereby reducing light-emission efficiency.

In view of the foregoing, the present disclosure provides an anisotropic conductive adhesive which achieves excellent optical properties and heat dissipation characteristics.

Solution to Problem

As a result of earnest investigation, the present inventors have found that the objectives described above can be achieved by blending conductive particles each comprising a resin particle coated on an outer surface by a metal layer having Ag as a primary constituent, solder particles and reflective insulating particles.

Thus, the anisotropic conductive adhesive according to the present disclosure comprises conductive particles each comprising a metal layer having Ag as a primary constituent formed on an outermost surface of a resin particle; solder particles having a smaller average particle diameter than the conductive particles; reflective insulating particles having a smaller average particle diameter than the solder particles; and a binder in which the conductive particles, the solder particles, and the reflective insulating particles are dispersed.

Furthermore, a connection structure according to the present invention comprises a first electronic component; a second electronic component; and an anisotropic conductive film for bonding the first electronic component and the second electronic component by using an anisotropic conductive adhesive containing conductive particles each comprising a metal layer having Ag as a primary constituent formed on an outermost surface of a resin particle, solder particles having an average particle diameter that is smaller than the conductive particles, reflective insulating particles having an average particle diameter that is smaller than the solder particles and a binder in which the conductive particles, the solder particles and the reflective insulating particles are dispersed; wherein terminals of the first electronic component and terminals of the second electronic component are electrically connected via the conductive particles and solder bonded by the solder particles.

Advantageous Effects of Invention

According to the present disclosure, by containing the conductive particles which each comprise a metal layer having Ag as a primary constituent formed on the outermost layer of a resin particle and because the reflective insulating particles have an average particle diameter that is smaller than that of the solder particles, a high reflectance and excellent optical characteristics are obtainable. Moreover, by containing the solder particles having a smaller average particle diameter than the conductive particles, solder bond contact area between terminals is increased and excellent heat dissipation characteristics are thereby obtainable.

DESCRIPTION OF EMBODIMENTS

Embodiments of the present disclosure will now be more particularly described according to the following order with reference to the accompanying drawings.
1. Anisotropic Conductive Adhesive
2. Method for Manufacturing Connection Structure
3. Examples

1. Anisotropic Conductive Adhesive

An anisotropic conductive adhesive according to the present embodiment comprises conductive particles each comprising a metal layer formed onto an outermost layer of a resin particle, solder particles having a smaller average particle diameter than the conductive particles and reflective insulating particles having a smaller average particle diameter than the solder particles dispersed in a binder (an adhesive component), which is in a paste or film form, among other forms, and which can be selected as appropriate according to the target application.

Figure 1:
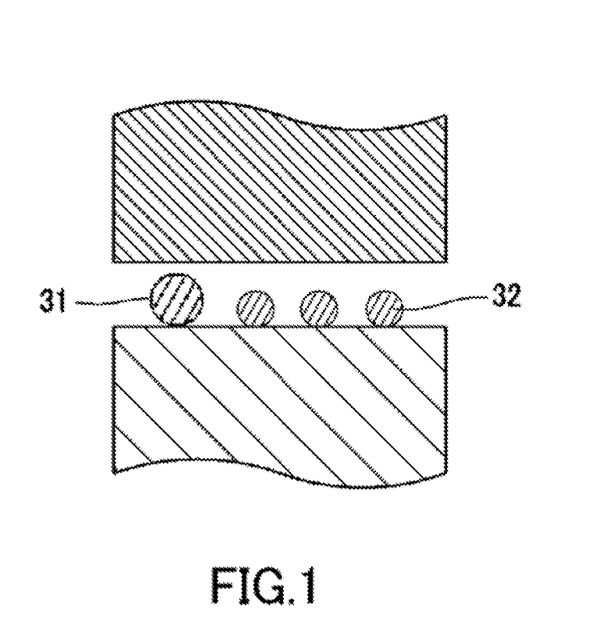
FIG. 1 is a schematic cross-sectional view illustrating opposing terminals before compression bonding.
Figure 2:
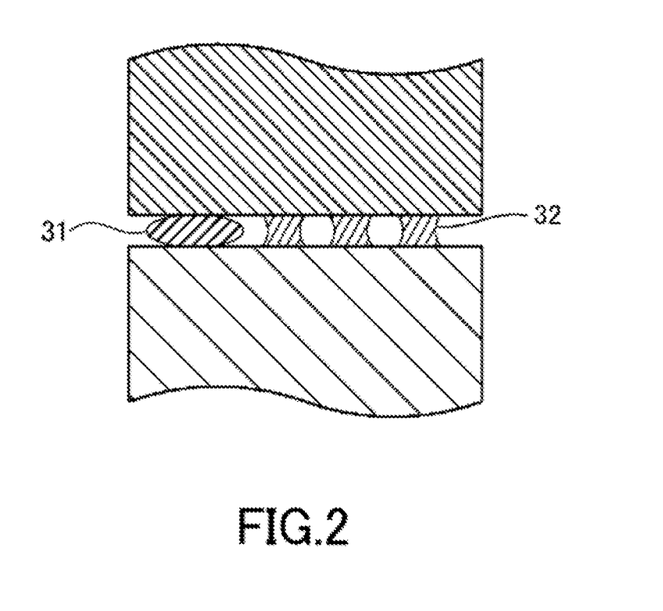
FIG. 2 is a schematic cross-sectional view illustrating opposing terminals after compression bonding.

FIGS. 1 and 2 are schematic cross-sectional views respectively illustrating opposing terminals before and after compression bonding. As illustrated in FIGS. 1 and 2, the solder particles 32 having a smaller average particle diameter than the conductive particles 31 at the time of pressure bonding are deformed after flattening deformation of the conductive particles 31 and a metallic bond is formed due to solder bonding by heating. Thus, contact area between the terminals is increased, thereby allowing improvements in heat dissipation properties and electrical characteristics. In the case of the solder particles 32 being larger than the conductive particles 31, it is possible for electrical leaks to be generated leading to poor yield rates.

Because the conductive particles are reflective and electrically conductive particles comprising a metal layer having Ag as a main constituent formed onto the outermost surface of resin particles, excess conductive particles which have not been trapped in terminal portions efficiently reflect light from the light-emissive portion of the LED chip, thereby improving the light-extraction efficiency of the LED mounting body.

Moreover, the reflective insulating particles efficiently reflect light from the light-emissive portion of the LED chip, thereby improving the light-extraction efficiency of the LED mounting body. Furthermore, the reflective insulating particles have a smaller average particle diameter than the solder particles, thereby enabling suppression of trapping of the reflective insulating particles between opposing terminals. Excellent heat dissipation properties and electrical characteristics in the LED mounting body are thus obtainable.

The conductive particles comprise metal-coated resin particles each having a metal layer containing Ag as a primary constituent formed on an outermost layer thereof. Examples of usable resin particles include those of epoxy resin, phenol resin, acrylic resin, acrylonitrile-styrene (AS) resin, benzoguanamine resin, divinylbenzene-type resin and styrene-type resin, among others. Additionally, to suppress an increase in resistance to flattening deformation of the conductive particles, the surfaces of the resin particles may be coated with Ni, among other materials. In such reflective conductive particles, by being easily compressed and deformed during compression, contact area with wiring patterns can be increased. Compensation for variance in wiring pattern height is thereby enabled.

Examples of other metals contained by the metal alloy having Ag as a primary constituent include Bi, Ti, Zr, Hf, V, Nb, Ta, Cr, Mo, W, Fe, Ru, Co, Rh, Ir, Ni, Pd, Pt, Cu, Au, Zn, Al, Ga, In, Si, Ge and Sn, among others. Among these, it is preferable to use an Ag alloy containing Ag at 95.0 to 99.8 atm %, Bi at 0.1 to 3.0 atm % and Nd at 0.1 to 2.0 atm %. Excellent reflectance and migration resistance are thereby obtainable.

Moreover, average particle diameter of the conductive particles is preferably 1 to 10 μm and more preferably 1 to 8 μm. Furthermore, in view of connection reliability and insulation reliability, blending amount of the conductive particles is preferably 1 to 100 pts. mass with respect to 100 pts. mass of binder.

The solder particles have a smaller average particle diameter than the conductive particles and, it is preferable that the solder particles have an average particle diameter of 20% or more and less than 100% of the average particle diameter of the conductive particles. Excessively small solder particles in comparison with the conductive particles leads to the solder particles not being trapped between opposing electrodes during compression and, because metal bonding does not occur, excellent heat dissipation and conduction characteristics are therefore unobtainable. However, excessively large solder particles in comparison with the conductive particles leads to, for example, leaks generated by shoulder touch occurring in edge portions of an LED chip due to the solder particles, thereby causing poor yields.

Solder particles can be selected as appropriate in accordance with electrode material and connection conditions from, for example, as defined in JIS Z 3282-1999, Sn—Pb, Pb—Sn—Sb, Sn—Sb, Sn—Pb—Bi, Bi—Sn, Sn—Cu, Sn—Pb—Cu, Sn—In, Sn—Ag, Sn—Pb—Ag and Pb—Ag types, among others. In addition, shape of the solder particles can be selected as appropriate from granular shapes and flake shapes, among others. It should be noted that, in order to improve anisotropic properties, the solder particles may be covered with an insulating layer.

Blending amount of the solder particles is preferably 1% to 30% by volume. An insufficient blending amount of the solder particles leads to excellent heat dissipation properties being unobtainable; an excessive blending amount impairs anisotropic properties, thereby making excellent connection reliability unobtainable.

The reflective insulating particles have a smaller average particle diameter than the solder particles, preferably being 2% or more and less than 30% of the average particle diameter of the solder particles. In the case of excessively small reflective insulating particles, efficient reflection of light from the light-emissive portion of the LED chip is impossible. Furthermore, excessively large reflective insulating particles in comparison with the solder particles leads to the reflective insulating particles becoming clamped between the solder particles and LED chip electrodes or between the solder particles and substrate wiring, thereby interfering with heat dissipation.

The reflective insulating particles are preferably selected from at least one of the group including titanium oxide ($TiO_2$), boron nitride (BN), zinc oxide (ZnO) and aluminum oxide ($Al_2O_3$). Due to particles being gray to white under natural light, such reflective insulating particles have a low wavelength dependence in reflecting visible light, thereby enabling improvements in light-emission efficiency. Among these, use of titanium oxide having a high index of refraction is particularly preferable.

Blending amount of the reflective insulating particles is preferably 1% to 50% by volume and more preferably 5% to 25% by volume. An insufficient blending amount of the reflective insulating particles leads to sufficient reflection of light being unachievable; an excessive amount of the reflective insulating particles impairs connection based on the conductive particles used in combination therewith.

With respect to blending amounts of the conductive particles, the solder particles and the reflective insulating particles, preferably, the blending amount of the solder particles is greater than the blending amount of the conductive particles, and the blending amount of the reflective insulating particles is greater than the blending amount of the solder particles. Excellent optical characteristics, heat dissipation characteristics and electrical characteristics are obtainable by such a blend.

As the binder, adhesive compositions used in conventional anisotropic conductive adhesives and anisotropic conductive films can be used. Examples of preferably used adhesive compositions include epoxy curing type adhesives having alicyclic epoxy compounds, heterocyclic epoxy compounds or hydrogenated epoxy compounds, among others, as a primary constituent.

Examples of preferable alicyclic epoxy compounds include those having two or more epoxy groups per molecule. These may be liquid or solid. Particularly, examples include glycidyl hexahydroterephthalic bisphenol A and 3,4-epoxy-cyclohexenyl methyl-3', 4'-epoxycyclohexane carboxylate, among others. Among these, 3,4-epoxy-cyclohexenyl methyl-3', 4'-epoxycyclohexane carboxylate is preferably used in view of excellent fast curing thereof and ensuring an appropriate cured-product transparency for mounting an LED element.

Examples of heterocyclic epoxy compound include epoxy compounds having a triazine ring and a particularly preferable example is 1,3,5-tris(2,3-epoxypropyl)-1,3,5-triazine-2,4,6-(1H, 3H, 5H)-trione.

Usable hydrogenated epoxy compounds include hydrogenated products of the alicyclic epoxy compounds or heterocyclic epoxy compounds described above as well as known hydrogenated epoxy resins.

Alicyclic epoxy compounds, heterocyclic epoxy compounds or hydrogenated epoxy compounds may be used individually or in a combination of two or more. In addition to these epoxy compounds, so long as effects of the present disclosure are not impaired, other epoxy compounds may be additionally used. Examples include glycidyl ethers obtained by reacting epichlorohydrin with polyhydric phenols such as bisphenol A, bisphenol F, bisphenol S, tetramethyl bisphenol A, diaryl bisphenol A, hydroquinone, catechol, resorcinol, cresol, tetrabromobisphenol A, trihydroxybiphenyl, benzophenone, bisresorcinol, bisphnol hexaflouroacetone, tetramethyl bisphenol A, tetramethyl bisphenol F, tris(hydroxyphenyl)methane, bixylenol, phenol novolac, and cresol novalac; polyglycidyl ethers obtained by reacting epichlorohydrin with polyhydric aliphatic alcohols such as glycerin, neopentyl glycol, ethylene glycol, propylene glycol, hexylene glycol, polyethylene glycol and polypropylene glycol; glycidyl ether esters obtained by reacting epichlorohydrin with hydroxycarboxlic acids such as p-oxybenzoic acid and 3-oxynaptholic acid; polyglycidyl esters obtained from polycarboxylic acids such as pthalic acid, methylpthalic acid, isopthalic acid, terephthalic acid, tetrahydrophtalic acid, endomethylene tetrahydrophthalic acid, endomethylene hexahydrophthalic acid, trimellitic acid, and polymerized fatty acids; glycidyl amino glycidyl ethers obtained from aminophenol or amino alkylphenol; glycidyl amino glycidyl ester obtainable from aminobenzoic acid; glycidylamines obtainable from substances such as aniline, toluidine, tribromoaniline, xylylenediamine, diaminocyclohexane, bis(aminomethyl)cyclohexane, 4,4'-diaminodiphenylmethane and 4,4'-diaminodiphenylsulfone; and epoxified polyolefin, among other known epoxy resins.

Examples of curing agents include acid anyhydrides, imidazole compounds and dicyan, among others. Among these, use of acid anhydride not prone to causing discoloration in cured products, particularly, alicyclic acid anhydride based curing agents, is preferable. In particular, preferable examples include methylhexahydrophthalic anhydride.

With respect to adhesive compositions, in the case of using an alicyclic epoxy compound and an alicyclic anhydrides based curing agent, in respective blending amounts, because insufficient alicyclic anhydride based curing agent leads to excessive uncured epoxy compound and excessive alicyclic anhydride based curing agent tends to promote adherend corrosion due to remaining curing agent, the alicyclic anhydride based curing agent is preferably blended at 80 to 120 pts. mass and more preferably 95 to 105 pts. mass with respect to 100 pts. mass of the alicyclic epoxy compound.

In the anisotropic conductive adhesive comprising such a configuration, at the time of pressure bonding, following flattening deformation of the conductive particles 31, the solder particles 32 having a smaller average particle diameter than the conductive particles 31 are deformed and are metal bonded by solder bonding due to heat application. Contact area with the terminals is thus increased, thereby allowing improvements in heat dissipation characteristics and electrical characteristics. Because the conductive particles comprise a metal layer having Ag as a main constituent formed onto the outermost surface of resin particles, excess conductive particles which have not been trapped in terminal portions efficiently reflect light from the light-emissive portion of the LED chip, thereby improving the light-extraction efficiency of the LED mounting body. Moreover, the reflective insulating particles efficiently reflect light from the light-emissive portion of the LED chip, thereby improving the light-extraction efficiency of the LED mounting body. Additionally, because the reflective insulating particles have an average particle diameter that is smaller than the solder particles, trapping of the reflective insulating particles between opposing terminals can be suppressed. Excellent heat dissipation properties and electrical characteristics in the LED mounting body are thus obtainable.

Particularly, in the case of using a corrosion-resistant Au plated substrate, in Au—Sn eutectic-only solder bonds, whereas the Au plating absorbs light from the light-emissive portion of the LED chip, thereby decreasing luminous flux, by using the anisotropic conductive adhesive in which the reflective conductive particles and the reflective insulating particles are blended, a high luminous flux is obtainable.

2. Connection Structure and Manufacturing Method Thereof

Next, a connection structure using the above-described anisotropic conductive adhesive will be explained. A connection structure according to the present embodiment comprises a first electronic component; a second electronic component; and an anisotropic conductive film for bonding the first electronic component and the second electronic component by using an anisotropic conductive adhesive containing conductive particles each comprising a metal layer having Ag as a primary constituent formed on an outermost surface of a resin particle, solder particles having an average particle diameter that is smaller than the conductive particles, reflective insulating particles having an average particle diameter that is smaller than the solder particles and a binder in which the conductive particles, the solder particles and the reflective insulating particles are dispersed; wherein terminals of the first electronic component and terminals of the second electronic component are electrically connected via the conductive particles and solder bonded by the solder particles.

In the present embodiment, preferred examples of the first electronic component include a chip (element) such as a heat producing LED (light-emitting diode) or a driver IC (integrated circuit) and a preferred example of the second electronic component is a substrate for mounting the chip.

Figure 3:
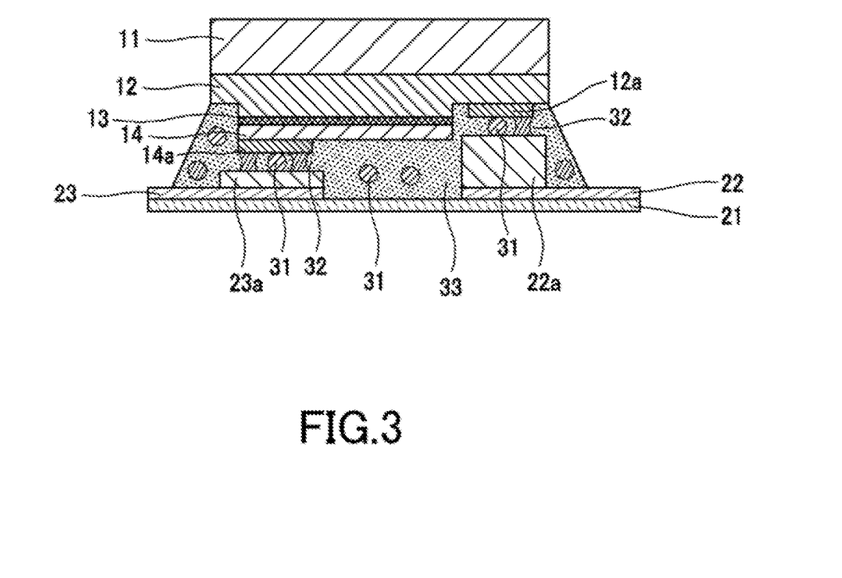
FIG. 3 is a cross-sectional view illustrating one example of an LED mounting body according to one embodiment of the present disclosure.

FIG. 3 is a cross-sectional view illustrating an example configuration of an LED mounting body. In this LED mounting body, an LED element and a substrate are connected by using the above-described anisotropic conductive adhesive in which the conductive particles 31 and the solder particles 32 having a smaller average particle diameter than the conductive particles are dispersed in an adhesive component.

The LED element comprises an element substrate 11 comprising, for example, sapphire on which a first conductive cladding layer 12 comprising, for example, n-GaN, an active layer 13 comprising, for example, $In_xAl_yGa_{1-x-y}N$ and a second conductive cladding layer 14 comprising, for example, p-GaN, and has a structure known as a double heterostructure. Furthermore, a first conductive electrode 12a is provided on a portion of the first conductive cladding layer 12 and a second conductive electrode 14a is provided on a portion of the second conductive cladding layer 14. Applying voltage between the first conductive electrode 12a and the second conductive electrode 14a of the LED element concentrates carriers in the active layer 13, the recombination of which generates light.

The substrate includes a substrate material 21 on which a first conductive circuit pattern 22 and a second conductive circuit pattern 23 are provided, and electrodes 22a and 23a provided at positions respectively corresponding to the first and second conductive electrodes 12a and 14a of the LED element.

As illustrated in FIG. 3, in the LED mounting body, terminals of the LED element (the electrodes 12a, 14a) and terminals of the substrate (the electrodes 22a, 23a) are electrically connected via the conductive particles 31 and further metallically bonded by solder bonding of the solder particles 32. Efficient dissipation towards the substrate side of heat generated by the active layer 13 of the LED element is thus enabled, thereby preventing light-emission efficiency decreases and extending LED mounting body lifetime.

Figure 4:
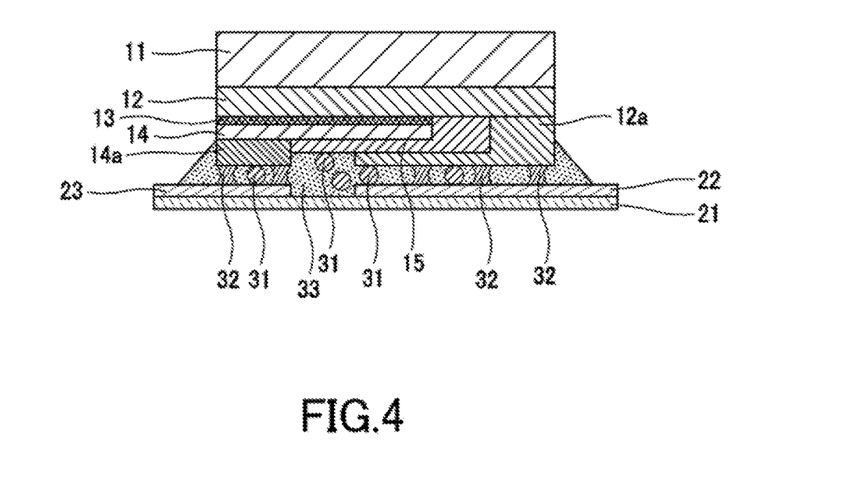
FIG. 4 is a cross-sectional view illustrating another example of an LED mounting body according to one embodiment of the present disclosure.

Additionally, as illustrated in FIG. 4, in a flip-chip-mounting LED, the passivation layer 105 enables large designs for terminals of the LED element (electrodes 12a, 14a), thereby enabling more of the conductive particles 31 and the solder particles 32 to be trapped between the terminals of the LED element (the electrodes 12a, 14a) and the terminals of the substrate (the circuit patterns 22, 23). Efficient dissipation towards the substrate side of heat generated by the active layer 13 is thereby enabled.

Next, a method for manufacturing the aforementioned connection structure will be described. A method for manufacturing a connection structure according to this embodiment comprises sandwiching an anisotropic conductive adhesive, which contains conductive particles each comprising a metal layer having Ag as a primary constituent formed on an outermost surface of a resin particle, solder particles having an average particle diameter that is smaller than the conductive particles, reflective insulating particles having an average particle diameter that is smaller than the solder particles and a binder in which the conductive particles, the solder particles and the reflective insulating particles are dispersed, between terminals of a first electronic component and terminals of a second electronic component and bonding the first electronic component and the second electronic component with thermocompression. Terminals of the first electronic component and the second electronic component are thereby electrically connected via the conductive particles; furthermore, solder bonding by the solder particles of terminals of the first electronic component and the second electronic component enables achievement of a connection structure having metallic bonding.

In the method for manufacturing a connection structure according to the present embodiment, during compression bonding, in addition to flattening deformation of the conductive particles due to pressure leading to electrical connection, solder bonding of the solder particles increases contact area between opposing terminals, thereby achieving high heat dissipation characteristics and an excellent connection reliability.

EXAMPLES

3. Examples

In the following, examples of the present disclosure will be described in detail; however, the scope of the present disclosure is not limited by these examples. In the following examples, anisotropic conductive pastes (ACP) were manufactured in which reflective conductive particles, solder particles and a white inorganic filler were blended, and reflectance was evaluated. Furthermore, LED mounting bodies were manufactured and total luminous flux, heat dissipation characteristics and electrical characteristics were evaluated.

Manufacturing of the reflective conductive particles, manufacturing of the anisotropic conductive adhesive, evaluation of reflectance, manufacturing of the LED mounting bodies, and evaluation of total luminous flux, heat dissipation characteristics and electrical characteristics of the LED mounting bodies were performed in the following manner.

Reflective Conductive Particles Manufacturing

Onto spherical acrylic resin particles having a 5.0 μm particle diameter, an Ag alloy (trade name GB100 manufactured by KOBE STEEL, LTD. (COBELCO)) was sputtered at a thickness of 0.25 μm to manufacture reflective conductive particles A having a 5.5 μm particle diameter.

Furthermore, onto resin-core Ni conductive particles having a 5.0 μm particle diameter, an Ag alloy (trade name GB100 manufactured by KOBE STEEL, LTD.) was sputtered at a thickness of 0.25 μm to manufacture reflective conductive particles B having a 5.5 μm particle diameter. For the Ni reflective conductive particles, spherical acrylic resin ($\phi$ 4.6 μm) having a surface Ni-plating (0.2 μmt) were used.

Furthermore, onto spherical acrylic resin particles having a 5.0 μm particle diameter, Au was sputtered at a thickness of 0.25 μm to manufacture reflective conductive particles C having a 5.5 μm particle diameter.

Anisotropic Conductive Adhesive Manufacturing

Into an epoxy curing adhesive agent (a binder having primary constituents of an epoxy resin (trade name CEL2021P manufactured by Daicel Corporation) and acid anhydride (MeHHPA, trade name MH700 manufactured by New Japan Chemical Co., Ltd.)), 2% by volume of the reflective conductive particles, 5% by volume of the solder particles and 10% by volume of titanium oxide as the white inorganic filler were blended to manufacture anisotropic conductive adhesives. As the solder particles, particles having average particle diameters (D50) of 0.8 μm, 1.1 μm, 5.0 μm, and 20 μm were prepared (trade name M797 (Sn-3.0Ag-0.5Cu) mp: 217° C. manufactured by Senju Metal Industry Co., Ltd.).

Reflectance Evaluation

The anisotropic conductive adhesive was applied at a thickness of 100 μm to a white plate before heating to cure under conditions of 200° C. for 1 minute. Reflectance of the anisotropic conductive film after curing was measured by a spectrophotometer.

LED Mounting Body Manufacturing

Using the anisotropic conductive adhesive, FC-mounting LED chips (trade name DA700 manufactured by Cree, Inc., Vf=3.2 V (If=350 mA) were mounted to an Au electrode substrate (ceramic substrate, conductor space=100 μmP, Ni/Au plating=5.0/0.3 μm). The anisotropic conductive adhesive was applied to the Au electrode substrate before aligning the LED chip and bonding with thermocompression under conditions of 260° C. for 10 seconds with a load of 1,000 g/chip.

Total Luminous Flux Evaluation

Total luminous flux of the LED mounting body was measured by a total luminous flux measuring device (LE-2100, Otsuka Electronics Co., Ltd.) with an integrating sphere.

Heat Dissipation Characteristics Evaluation

Thermal resistance (° C./W) of the LED mounting body when lit for 0.1 seconds was measured by a transient thermal resistance measurement device (T3Ster manufactured by Mentor Graphics). Measurements conditions were If=350 mA and Im=1 mA.

Electrical Characteristics Evaluation

As an initial Vf value, Vf when If=350 mA was measured.

Furthermore, the LED mounting body was lit for 500 hours under conditions of 85° C. and 85% RH (high-temperature and high-humidity test); Vf when If=350 mA was measured. It should be noted that only initially non-defective products were tested in the high-temperature and high-humidity test. In initial evaluation, leak occurrence was evaluated as fail (hereinafter referred to as "F") and all other cases were evaluated as good (hereinafter referred to as "G"). In post-high-temperature and high-humidity evaluation, a change from the initial Vf of 5% or more was evaluated as F and a change from the initial Vf of less than 5% was evaluated as G.

Table 1 represents evaluation results of optical characteristics, heat dissipation characteristics and electrical characteristics for examples and comparative examples.

example, Comparative Example 1), improvements were achievable in optical characteristics and heat dissipation characteristics. Furthermore, in the LED mounting body, initial conduction reliability was evaluated as G, conduction reliability after testing by lighting under conditions of 85° C. at 85% RH for 3,000 hours was G such that stable electrical characteristics were obtainable.

Example 2

As represented in Table 1, to the binder, reflective conductive particles (particle diameter (D50): 5.5 μm) appearing gray and comprising Ni-plated resin particles coated with an Ag alloy (Ag:Bi:Nd=99:0.7:0.3), solder particles (particle diameter (D50): 1.1 μm) and titanium oxide (particle diameter (D50): 0.25 μm) were blended to manufacture an anisotropic conductive adhesive.

Reflectance of the anisotropic conductive adhesive at a wavelength of 450 nm was 60%. Furthermore, an LED mounting body manufactured by using the anisotropic con-

TABLE 1

|  |  |  | Ex. 1 | Ex. 2 | Ex. 3 | Ex. 4 | Ex. 5 | Comp. 1 | Comp. 2 | Comp. 3 | Ref. 1 | Ref. 2 | Ref. 3 |
|---|---|---|---|---|---|---|---|---|---|---|---|---|---|
| Reflective Conductive Particles | Core Particle | Type | Ni-plated acrylic particles | Ni-plated acrylic particles | Ni-plated acrylic particles | Ni-plated acrylic particles | Acrylic particles | Ni-plated acrylic particles | Ni-plated acrylic particles | Ni-plated acrylic particles | Ni-plated acrylic particles | Ni-plated acrylic particles | Ni-plated acrylic particles |
|  | Outermost Surface Metal Composition Ratio | Ag | 99 | 99 | 99 | 99 | 99 | — | 99 | 99 | 99 | 99 | 99 |
|  |  | Bi | 0.7 | 0.7 | 0.7 | 0.7 | 0.7 | — | 0.7 | 0.7 | 0.7 | 0.7 | 0.7 |
|  |  | Nd | 0.3 | 0.3 | 0.3 | 0.3 | 0.3 | — | 0.3 | 0.3 | 0.3 | 0.3 | 0.3 |
|  |  | Au | — | — | — | — | — | 100 | — | — | — | — | — |
|  | Particle Appearance | Color | Grey | Grey | Grey | Grey | Grey | Brown | Grey | Grey | Grey | Grey | Grey |
|  | Particle Dia. (D50) [μm] |  | 5.8 | 5.8 | 5.8 | 5.5 | 5.5 | 5.5 | 5.5 | 5.5 | 5.5 | 5.5 | 5.5 |
|  | Blending Amount [% vol.] |  | 2 | 2 | 2 | 2 | 2 | 2 | 2 | 2 | 2 | 2 | 2 |
| Solder Particles | Particle Dia. (D50) [μm] |  | 5.0 | 1.1 | 5.0 | 5.0 | 5.0 | — | — | 20.0 | 0.8 | 5.0 | 5.0 |
|  | Blending Amount [% vol.] |  | 5 | 5 | 5 | 5 | 5 | — | — | 5 | 5 | 5 | 5 |
| White Inorganic filler | Type |  | TiO$_2$ | TiO$_2$ | TiO$_2$ | TiO$_2$ | TiO$_2$ | — | TiO$_2$ | TiO$_2$ | TiO$_2$ | TiO$_2$ | TiO$_2$ |
|  | Particle Dia. (D50) [μm] |  | 0.25 | 0.25 | 0.18 | 1.00 | 0.25 | — | 0.25 | 0.25 | 0.25 | 0.02 | 3.00 |
| Optical Characteristics | Reflectance [%] at 450 nm |  | 65 | 60 | 55 | 50 | 64 | 8 | 70 | 67 | 58 | 20 | 40 |
|  | Total Luminous Flux [lm] | Initial | 7.0 | 8.5 | 6.0 | 5.7 | 6.9 | 3.3 | 7.5 | — | 6.3 | 3.7 | 5.0 |
|  | Total luminous flux change [%] | 85° C. 85% RH lit for 500 h | 0 | 0 | 0 | 0 | 0 | 0 | 0 | — | 0 | 0 | 0 |
| Heat Dissipation Characteristics | Thermal Resistance | [° C./W] | 13.2 | 13.6 | 12.5 | 14.5 | 13.0 | 40.0 | 40.0 | — | 19.8 | 12.3 | 30.0 |
| Electrical Characteristics | Conduction Reliability | Initial | G | G | G | G | G | G | G | F | G | G | G |
|  |  | 85° C. 85% RH lit for 3000 h | G | G | G | G | G | G | G | — | F | G | F |

Example 1

As represented in Table 1, to the binder, reflective conductive particles (particle diameter (D50): 5.5 μm) appearing gray and comprising Ni-plated resin particles coated with an Ag alloy (Ag:Bi:Nd=99:0.7:0.3), solder particles (particle diameter (D50): 5.0 μm) and titanium oxide (particle diameter (D50): 0.25 μm) were blended to manufacture an anisotropic conductive adhesive.

Reflectance of the anisotropic conductive adhesive at a wavelength of 450 nm was 65%. Furthermore, an LED mounting body manufactured by using the anisotropic conductive adhesive had a total luminous flux of 7.0 lm and a thermal resistance in electrically connected portions of 13.2° C./W such that, in contrast to conventional ACP (for ductive adhesive had a total luminous flux of 6.5 lm and a thermal resistance in electrically connected portions of 13.6° C./W such that, in contrast to conventional ACP (for example, Comparative Example 1), improvements were achievable in optical characteristics and heat dissipation characteristics. Furthermore, in the LED mounting body, initial conduction reliability was evaluated as G, conduction reliability after testing by lighting under conditions of 85° C. at 85% RH for 3,000 hours was G such that stable electrical characteristics were obtainable.

Example 3

As represented in Table 1, to the binder, reflective conductive particles (particle diameter (D50): 5.5 μm) appearing gray and comprising Ni-plated resin particles coated with an Ag alloy (Ag:Bi:Nd=99:0.7:0.3), solder particles (particle diameter (D50): 5.0 μm) and titanium oxide (particle diameter (D50): 0.18 μm) were blended to manufacture an anisotropic conductive adhesive.

Reflectance of the anisotropic conductive adhesive at a wavelength of 450 nm was 55%. Furthermore, an LED mounting body manufactured by using the anisotropic conductive adhesive had a total luminous flux of 6.0 lm and a thermal resistance in electrically connected portions of 12.5° C./W and, in contrast to conventional ACP (for example, Comparative Example 1), improvements were achievable in optical characteristics and heat dissipation characteristics. Furthermore, in the LED mounting body, initial conduction reliability was evaluated as G, conduction reliability after testing by lighting under conditions of 85° C. at 85% RH for 3,000 hours was G such that stable electrical characteristics were obtainable.

Example 4

As represented in Table 1, to a binder, reflective conductive particles (particle diameter (D50): 5.5 μm) appearing gray and comprising Ni-plated resin particles coated with an Ag alloy (Ag:Bi:Nd=99:0.7:0.3), solder particles (particle diameter (D50): 5.0 μm) and titanium oxide (particle diameter (D50): 1.0 μm) were blended to manufacture an anisotropic conductive adhesive.

Reflectance of the anisotropic conductive adhesive at a wavelength of 450 nm was 50%. Furthermore, an LED mounting body manufactured by using the anisotropic conductive adhesive had a total luminous flux of 5.7 lm and a thermal resistance in electrically connected portions of 14.5° C./W and, in contrast to conventional ACP (for example, Comparative Example 1), improvements were achievable in optical characteristics and heat dissipation characteristics. Furthermore, in the LED mounting body, initial conduction reliability was evaluated as G, conduction reliability after testing by lighting under conditions of 85° C. at 85% RH for 3,000 hours was G such that stable electrical characteristics were obtainable.

Example 5

As represented in Table 1, to a binder, reflective conductive particles (particle diameter (D50): 5.5 μm) appearing gray and comprising spherical resin particles coated by an Ag alloy (Ag:Bi:Nd=99:0.7:0.3), solder particles (particle diameter (D50): 5.0 μm) and titanium oxide (particle diameter (D50): 0.25 μm) were blended to manufacture an anisotropic conductive adhesive.

Reflectance of the anisotropic conductive adhesive at a wavelength of 450 nm was 64%. Furthermore, the LED mounting body manufactured by using the anisotropic conductive adhesive had a total luminous flux of 6.9 lm and a thermal resistance of electrically connected portions of 13.0° C./W and, in contrast to conventional ACP (for example, Comparative Example 1), improvements were achievable in optical characteristics and heat dissipation characteristics. Furthermore, in the LED mounting body, initial conduction reliability was evaluated as G, conduction reliability after testing by lighting under conditions of 85° C. at 85% RH for 3,000 hours was G such that stable electrical characteristics were obtainable.

Comparative Example 1

As represented in Table 1, to a binder, reflective conductive particles (particle diameter (D50): 5.5 μm) appearing brown comprising spherical resin particles coated with an Au alloy were blended to manufacture an anisotropic conductive adhesive.

Reflectance of the anisotropic conductive adhesive at a wavelength of 450 nm was 8%. Furthermore, an LED mounting body manufactured by using the anisotropic conductive adhesive had a total luminous flux of 3.3 lm and a thermal resistance in electrically connected portions of 40.0° C./W, which was high. Furthermore, in the LED mounting body, initial conduction reliability was evaluated as G, conduction reliability after testing by lighting under conditions of 85° C. at 85% RH for 3,000 hours was G such that stable electrical characteristics were obtainable.

Comparative Example 2

As represented in Table 1, to a binder, reflective conductive particles (particle diameter (D50): 5.5 μm) appearing gray and comprising Ni-plated resin particles coated with an Ag alloy (Ag:Bi:Nd=99:0.7:0.3) and titanium oxide (particle diameter (D50): 0.25 μm) were blended to manufacture an anisotropic conductive adhesive.

Reflectance of the anisotropic conductive adhesive at a wavelength of 450 nm was 70%. Furthermore, an LED mounting body manufactured by using the anisotropic conductive adhesive had a total luminous flux of 7.5 lm and a thermal resistance in electrically connected portions of 40.0° C./W, which was high. Furthermore, in the LED mounting body, initial conduction reliability was evaluated as G, conduction reliability after testing by lighting under conditions of 85° C. at 85% RH for 3,000 hours was G such that stable electrical characteristics were obtainable.

Comparative Example 3

As represented in Table 1, to a binder, reflective conductive particles (particle diameter (D50): 5.5 μm) appearing gray and comprising Ni-plated resin particles coated with an Ag alloy (Ag:Bi:Nd=99:0.7:0.3), solder particles (particle diameter (D50): 20.0 μm) and titanium oxide (particle diameter (D50): 0.25 μm) were blended to manufacture an anisotropic conductive adhesive.

Reflectance of the anisotropic conductive adhesive at a wavelength of 450 nm was 67%. Furthermore, the LED mounting body manufactured by using the anisotropic conductive adhesive had an initial conduction reliability evaluation of F in that an electrical leak was generated. Consequently, total luminous flux, heat dissipation and electrical characteristics were not evaluated. Electrical leaks are presumably generated by the solder particles being excessively large and therefore causing short circuits between wiring.

Reference Example 1

As represented in Table 1, to the binder, reflective conductive particles (particle diameter (D50): 5.5 μm) appearing gray and comprising Ni-plated resin particles coated with an Ag alloy (Ag:Bi:Nd=99:0.7:0.3), solder particles (particle diameter (D50): 0.8 μm) and titanium oxide (particle diameter (D50): 0.25 μm) were blended to manufacture an anisotropic conductive adhesive.

Reflectance of the anisotropic conductive adhesive at a wavelength of 450 nm was 58%. Furthermore, an LED mounting body manufactured by using the anisotropic conductive adhesive had a total luminous flux of 6.3 lm and a thermal resistance in electrically connected portions of 19.8° C./W, which was slightly high. This is presumably because many portions between the LED chip and the substrate wiring are not metallically bonded due to the solder particles being excessively small. Furthermore, in the LED mounting body, initial conduction reliability was evaluated as G, conduction reliability after testing by lighting under conditions of 85° C. at 85% RH for 3,000 hours was F in that Vf varied by more than 5% from the initial value after the high-temperature high-humidity test.

Reference Example 2

As represented in Table 1, to a binder, reflective conductive particles (particle diameter (D50): 5.5 μm) appearing gray and comprising Ni-plated resin particles coated with an Ag alloy (Ag:Bi:Nd=99:0.7:0.3), solder particles (particle diameter (D50): 5.0 μm) and titanium oxide (particle diameter (D50): 0.02 μm) were blended to manufacture an anisotropic conductive adhesive.

Reflectance of the anisotropic conductive adhesive at a wavelength of 450 nm was 20%. Furthermore, the LED mount body manufactured by using the anisotropic conductive adhesive had a low total luminous flux of 3.7 lm. This was presumably due to reflective properties being unobtainable because the titanium oxide particle diameter was much smaller than the wavelength of light emitted by the LED. Furthermore, thermal resistance in electrically connected portions of the LED mounting body was 12.3° C./W. In addition, in the LED mounting body, conduction reliability was evaluated as G for initial and evaluated as G after a lighting test under conditions of 85° C. at 85% RH for 3,000 hours.

Reference Example 3

As represented in Table 1, to a binder, reflective conductive particles (particle diameter (D50): 5.5 μm) appearing gray and comprising Ni-plated resin particles coated with an Ag alloy (Ag:Bi:Nd=99:0.7:0.3), solder particles (particle diameter (D50): 5.0 μm) and titanium oxide (particle diameter (D50): 3.0 μm) were blended to manufacture an anisotropic conductive adhesive.

Reflectance of the anisotropic conductive adhesive at a wavelength of 450 nm was 40%. Furthermore, the LED mount body manufactured by using the anisotropic conductive adhesive had a total luminous flux of 5.0 lm and a thermal resistance in electrically connected portions of 30.0° C./W, which was high. This was presumably due to solder particle deformation impairment due to titanium oxide acting as a spacer between chip electrodes and substrate electrodes. Furthermore, in the LED mounting body, initial conduction reliability was evaluated as G, conduction reliability after testing by lighting under conditions of 85° C. at 85% RH for 3,000 hours was F in that Vf varied by more than 5% from the initial value after the high-temperature high-humidity test.

As in Examples 1 to 5, by blending conductive particles comprising metal layers formed onto outermost layers of resin particles, solder particles having a smaller average diameter than the conductive particles, and reflective insulating particles having a smaller diameter than the solder particles, improvements were enabled in LED mounting body optical characteristics and heat dissipation characteristics. Further, as in Examples 1 to 5, by average particle diameter of the solder particles being 20% or more and less than 100% of the particle diameter of the conductive particles, excellent heat dissipation characteristics in which thermal resistance is 15° C./W or less were obtained. Still further, by average particle diameter of the reflective insulating particles being 2% or more and less than 30% of the average particle diameter of the solder particles, excellent optical characteristics in which reflectance is 50% or more were obtained.

REFERENCE SIGNS LIST 11 element substrate, 12 first conductive cladding layer, 13 active layer, 14 second conductive cladding layer, 21 substrate material, 22 first conductive circuit pattern, 23 second conductive circuit pattern, 15 passivation layer, 31 conductive particles, 32 solder particles, 33 binder, 101 element substrate, 102 first conductive cladding layer, 103 active layer, 104 second conductive cladding layer, 105 passivation layer, 201 substrate material, 202 first conductive circuit pattern, 203 second conductive circuit pattern, 301 wire bonds, 302 die bonding material, 303 conductive paste, 304 sealing resin, 305 binder, 306 conductive particles, 307 gold-tin alloy

The invention claimed is:

1. An anisotropic conductive adhesive comprising:
   conductive particles each comprising a metal layer having Ag as a primary constituent formed on an outermost surface of a resin particle;
   solder particles having a smaller average particle diameter than the conductive particles;
   reflective insulating particles having a smaller average particle diameter than the solder particles; and
   a binder in which the conductive particles, the solder particles, and the reflective insulating particles are dispersed.

2. The anisotropic conductive adhesive according to claim 1, wherein the average particle diameter of the solder particles is 20% or more and less than 100% of the average particle diameter of the conductive particles.

3. The anisotropic conductive adhesive according to claim 2, wherein the average particle diameter of the reflective insulating particles is 2% or more and less than 30% of the average particle diameter of the solder particles.

4. The anisotropic conductive adhesive according to claim 2, wherein a blending amount of the solder particles is greater than a blending amount of the conductive particles; and
   wherein a blending amount of the reflective insulating particles is greater than the blending amount of the solder particles.

5. The anisotropic conductive adhesive according to claim 2, wherein the reflective insulating particles comprise at least one member selected from the group consisting of titanium oxide, boron nitride, zinc oxide and aluminum oxide.

6. The anisotropic conductive adhesive according to claim 2, wherein the metal layer having Ag as a primary constituent contains Ag at 95.0 to 99.8 atm %, Bi at 0.1 to 3.0 atm % and Nd at 0.1 to 2.0 atm %.

7. The anisotropic conductive adhesive according to claim 1, wherein the average particle diameter of the reflective insulating particles is 2% or more and less than 30% of the average particle diameter of the solder particles.

8. The anisotropic conductive adhesive according to claim 7, wherein a blending amount of the solder particles is greater than a blending amount of the conductive particles; and
   wherein a blending amount of the reflective insulating particles is greater than the blending amount of the solder particles.

9. The anisotropic conductive adhesive according to claim 7, wherein the reflective insulating particles comprise at least one member selected from the group consisting of titanium oxide, boron nitride, zinc oxide and aluminum oxide.

10. The anisotropic conductive adhesive according to claim 7, wherein the metal layer having Ag as a primary constituent contains Ag at 95.0 to 99.8 atm %, Bi at 0.1 to 3.0 atm % and Nd at 0.1 to 2.0 atm %.

11. The anisotropic conductive adhesive according to claim 1, wherein a blending amount of the solder particles is greater than a blending amount of the conductive particles; and
wherein a blending amount of the reflective insulating particles is greater than the blending amount of the solder particles.

12. The anisotropic conductive adhesive according to claim 11, wherein the reflective insulating particles comprise at least one member selected from the group consisting of titanium oxide, boron nitride, zinc oxide and aluminum oxide.

13. The anisotropic conductive adhesive according to claim 11, wherein the metal layer having Ag as a primary constituent contains Ag at 95.0 to 99.8 atm %, Bi at 0.1 to 3.0 atm % and Nd at 0.1 to 2.0 atm %.

14. The anisotropic conductive adhesive according to claim 1, wherein the reflective insulating particles comprise at least one member selected from the group consisting of titanium oxide, boron nitride, zinc oxide and aluminum oxide.

15. The anisotropic conductive adhesive according to claim 14, wherein the metal layer having Ag as a primary constituent contains Ag at 95.0 to 99.8 atm %, Bi at 0.1 to 3.0 atm % and Nd at 0.1 to 2.0 atm %.

16. The anisotropic conductive adhesive according to claim 1, wherein the metal layer having Ag as a primary constituent contains Ag at 95.0 to 99.8 atm %, Bi at 0.1 to 3.0 atm % and Nd at 0.1 to 2.0 atm %.

17. A connection structure comprising:
a first electronic component;
a second electronic component; and
an anisotropic conductive film for bonding the first electronic component and the second electronic component by using an anisotropic conductive adhesive containing conductive particles each comprising a metal layer having Ag as a primary constituent formed on an outermost surface of a resin particle, solder particles having an average particle diameter that is smaller than the conductive particles, reflective insulating particles having an average particle diameter that is smaller than the solder particles and a binder in which the conductive particles, the solder particles and the reflective insulating particles are dispersed;
wherein terminals of the first electronic component and terminals of the second electronic component are electrically connected via the conductive particles and solder bonded by the solder particles.

18. The connection structure according to claim 17, wherein:
the first electronic component is an LED element; and
the second electronic component is a substrate.

19. A method for manufacturing a connection structure comprising:
sandwiching an anisotropic conductive adhesive, which contains conductive particles each comprising a metal layer having Ag as a primary constituent formed on an outermost surface of a resin particle, solder particles having an average particle diameter that is smaller than the conductive particles, reflective insulating particles having an average particle diameter that is smaller than the solder particles and a binder in which the conductive particles, the solder particles and the reflective insulating particles are dispersed, between terminals of a first electronic component and terminals of a second electronic component and bonding the first electronic component and the second electronic component with thermocompression.

* * * * *